US010138089B2

(12) United States Patent
Chen

(10) Patent No.: US 10,138,089 B2
(45) Date of Patent: Nov. 27, 2018

(54) FLEXIBLE PRINTED CIRCUIT BOARD REEL DEVICE

(71) Applicants: Yi Chen Chen, Taipei (TW); I-MORE SCIENCE AND TECHNOLOGY COMPANY (SHENZHEN), Taipei (TW); TOP DEN ELECTRONICS LIMITED (DONG GUAN), Dongguan (TW)

(72) Inventor: Yi Chen Chen, Taipei (TW)

(73) Assignees: YI CHEN CHEN, Taipei (TW); I-MORE SCIENCE AND TECHNOLOGY COMPANY (SHENZHEN), Taipei (TW); TOP DEN ELECTRONICS LIMITED (DONG GUAN), Dongguan (CN)

( * ) Notice: Subject to any disclaimer, the term of this patent is extended or adjusted under 35 U.S.C. 154(b) by 220 days.

(21) Appl. No.: 15/302,841

(22) PCT Filed: Mar. 20, 2015

(86) PCT No.: PCT/CN2015/074722
§ 371 (c)(1),
(2) Date: Oct. 7, 2016

(87) PCT Pub. No.: WO2015/169128
PCT Pub. Date: Nov. 12, 2015

(65) Prior Publication Data
US 2017/0129738 A1    May 11, 2017

(30) Foreign Application Priority Data

May 5, 2014    (CN) .......................... 2014 1 0187000

(51) Int. Cl.
*B65H 75/44*    (2006.01)
*H02G 11/02*    (2006.01)
(Continued)

(52) U.S. Cl.
CPC ......... *B65H 75/4471* (2013.01); *B65H 75/28* (2013.01); *B65H 75/486* (2013.01);
(Continued)

(58) Field of Classification Search
CPC .. B65H 75/28; B65H 75/486; B65H 75/4471; H02G 11/02; H05K 1/028; H05K 3/361; H05K 2201/051
See application file for complete search history.

(56) References Cited

U.S. PATENT DOCUMENTS 4,026,489 A * 5/1977 James .................... B65H 75/28
242/586.2
6,056,226 A * 5/2000 Green .................. B65H 75/364
191/12.2 R
(Continued)

FOREIGN PATENT DOCUMENTS

CN    103950799 A    7/2014
CN    203877666 U    10/2014
(Continued)

*Primary Examiner* — Michael E Gallion
(74) *Attorney, Agent, or Firm* — Rabin & Berdo, P.C.

(57) ABSTRACT

A flexible printed circuit board reel device, which includes a left housing, a right housing, a rotary sleeve, an upper spiral spring and a lower spiral spring. The left housing and the right housing of the reel device are caught on each other to form a housing, and the left housing and the right housing are firmly and closely fixed with each other, which can increase the connection area, whereby the left and right housings are not easily separated from each other, and the housing can have a strong structure. The upper spiral spring, the lower spiral spring, an upper central shaft and a lower central shaft of the reel device form a symmetrical and balanced double-spring structure; when a flexible printed circuit board is reeled or unreeled, the force generated by the springs is evenly distributed over the upper portion and the lower portion of the rotary sleeve.

15 Claims, 14 Drawing Sheets

(51) Int. Cl.
*B65H 75/48* (2006.01)
*H05K 1/02* (2006.01)
*B65H 75/28* (2006.01)
*H05K 3/36* (2006.01)

(52) U.S. Cl.
CPC .............. *H02G 11/02* (2013.01); *H05K 1/028* (2013.01); *H05K 3/361* (2013.01); *H05K 2201/051* (2013.01)

(56) References Cited

U.S. PATENT DOCUMENTS

| | | | | |
|---|---|---|---|---|
| 6,942,079 | B2 * | 9/2005 | Chang | H02G 11/02 |
| | | | | 191/12.4 |
| 2006/0157608 | A1 * | 7/2006 | Liao | B65H 75/4431 |
| | | | | 242/378.4 |
| 2007/0007379 | A1 * | 1/2007 | Leyden | B65H 75/486 |
| | | | | 242/371 |
| 2013/0320925 | A1 * | 12/2013 | Yu | H01R 13/72 |
| | | | | 320/111 |
| 2014/0224913 | A1 * | 8/2014 | Wilson | B65H 75/4402 |
| | | | | 242/378 |
| 2018/0100350 | A1 * | 4/2018 | Huang | E06B 9/322 |

FOREIGN PATENT DOCUMENTS

| | | | | |
|---|---|---|---|---|
| DE | 2444053 | A1 * | 4/1975 | .............. A47L 9/26 |
| FR | 2783508 | B1 | 12/2000 | |
| TW | M250576 | U | 11/2004 | |
| TW | M344667 | U | 11/2008 | |

* cited by examiner

FLEXIBLE PRINTED CIRCUIT BOARD REEL DEVICE

TECHNICAL FIELD

The present disclosure relates to a reel device, in particular to a flexible printed circuit board (FPC board) reel device.

BACKGROUND

Currently, reel device is usually applied to reel the wires of corded earphone, mouse, keyboard, charger and the like. The basic principle is that the wire can be reeled along a spiral path or ring path via the elasticity of the spiral spring; when the wire is unreeled, the movement of pulling out the wire is slightly restricted due to the restriction force from the spiral spring, but the restriction force can be easily overcome. Thus, when the user can reel or unreel the wire along a certain path, and the power applied by the user can be slighting restricted, so the user can smoothly reel or unreel the wire.

In recent years, some manufacturers apply reel device to reel or unreel flexible printed circuit board. However, the difference is that they use the device to reel or unreel wider and flat flexible printed circuit board, such as server; one end of a flexible printed circuit board connects to the mainboard of a server, and the other end thereof connects to the hard disk or circuit board of the server is a draw-out structure. When one end of the hard disk or circuit board of the server is pulled out, the reel device unreels the flexible printed circuit board; when one end of the hard disk or circuit board of the server is pushed in, the reel device automatically reels the flexible printed circuit board. Therefore, when the flexible printed circuit board is reeled or unreeled in the limited space of the housing of the server, the reel device can pull out the flexible printed circuit board by a certain length according to the requirement, and the flexible printed circuit board can have a certain tension and balance force, such that the long flexible printed circuit board can keep a safe distance with a lot of high-temperature electronic components in the narrow space.

The conventional flexible printed circuit board reel device is as shown in FIG. 1~FIG. 2, and its major components include an upper housing 101, a lower housing 102, a rotary sleeve 103, a spiral spring 104 and a sleeve cover 105. The upper housing 101 is provided with 4 upper plastic columns downward and integrally formed with the four corners thereof; the lower housing 102 is provided with 4 upper plastic columns upward and integrally formed with the four corners thereof; the bottom of each of the upper plastic columns 101_1 is provided with a protrusion edge, and the top of each of the lower plastic columns 102_1 is provided with a ring stage corresponding to the protrusion edge. The lower housing 102 is provided with a central shaft 106 upward and integrally formed with the center thereof, and the top of the central shaft 106 is provided with a clamping groove. The rotary sleeve 103 is provided with the axial hole corresponding to the central shaft 106, and the top of the rotary sleeve 103 is provided with an accommodating space 103_1 for accommodating the spiral spring 104, and the outer surface of the rotary sleeve 103 is further provided with a protection sheet 107; a buckle area is formed between the protection sheet 107 and the rotary sleeve 103, and the buckle area is slightly larger than the thickness of one layer of the flexible printed circuit board 108. The assembly process is: first, put the flexible printed circuit board into the buckle area of the rotary sleeve 103; then, put the spiral spring 104 into the accommodating space 103_1 of the rotary sleeve 103, and then the inner center of the spiral spring 104 is caught at the clamping groove of the central shaft 106, and the outer end of the spiral spring 104 is caught at the rotary sleeve 103; afterward, align the axial hole of the rotary sleeve 103 with the central shaft 106 of the lower housing 102, and then insert the rotary sleeve 103 into the central shaft 106; then, insert the protrusion edge at the bottom of the upper plastic column 101_1 of the upper housing 101 into the ring stage at the top of the lower plastic column 102_1 of the lower housing 102 to combine the upper housing 101 and the lower housing 102, such that four upper plastic columns 101_1 and four lower plastic column 102_1 form the two plastic columns at the left side and two plastic columns at the right side; further, one end of the flexible printed circuit board 108 passes through the space between the two plastic columns at the left side, and the other end thereof passes through the space between the two plastic columns at the right side; finally, fasten up the upper housing 101 and the lower housing 102 by screws. The stretching operation principle is: during the initial status, the flexible printed circuit board 108 is reeled around the rotary sleeve 103; when it is necessary to pull out the flexible printed circuit board 108, the user can pull one end or both ends of the flexible printed circuit board 108 to stretch the flexible printed circuit board 108 and make the flexible printed circuit board 108 being the stretching status; at this time, if the user release the flexible printed circuit board 108 or let it freely move with the rotary sleeve 103, the rotary sleeve 103 rotates by the spring force provided by the spiral spring 104, so the flexible printed circuit board 108 can be reeled by the rotary sleeve 103 to return to the initial status in this way, the flexible printed circuit board 108 can be automatically reeled.

The shortcoming of the conventional flexible printed circuit board reel device is: (1) the housing structure composed of the upper housing 101 and the lower housing 102 is only supported by 4 plastic columns; in other words, the housing only has 4 connection points; thus, the upper housing 101 and the lower housing 102 tend to be easily separated by each other, so the structure is not strong and stable enough; (2) the housing only has one spiral spring 104, and the spiral spring 104 is at the top of the rotary sleeve 103; when the flexible printed circuit board 108 is reeled or unreeled, the force and the reaction force generated by the spiral spring 104 becoming tight or loose will concentrate on the upper portion of the rotary sleeve 103, such that the rotary sleeve 103 cannot be balanced, which make the rotary sleeve 103 cannot rotate smoothly or even get damaged.

SUMMARY

Therefore, it is a primary objective of the present invention to provide a flexible printed circuit board reel device with strong and stable structure, not tending to be damaged and the rotary sleeve thereof can rotate smoothly.

The present invention is realized by the following technical measures: a flexible printed circuit board reel device, which includes a left housing, a right housing, a rotary sleeve, an upper spiral spring and a lower spiral spring. The left housing and the right housing are caught on each other to form a housing, and the right housing and the left housing are respectively provided with a board outlet. The upper portion of the rotary sleeve is provided with an upper accommodating space and the lower portion of the rotary sleeve is provided with a lower accommodating space, and the upper spiral spring is disposed in the upper accommodating space and the lower spiral spring is disposed at the lower accommodating space. The upper portion of the housing is provided with an upper central shaft and the lower portion of the housing is provided with a lower central shaft. The upper central shaft extends into the upper accommodating space of the rotary sleeve and catches the upper spiral spring and the lower central shaft extends into the lower accommodating space of the rotary sleeve and catches the lower spiral spring, whereby the rotary sleeve is rotatably disposed in the housing, and the outer surface of the rotary sleeve is provided with a protection sheet for catching the flexible printed circuit board.

The technical effects of the present invention are: the housing is composed of the left housing and the right housing closely fixed with each other, which can increase the connection area, whereby the left and right housings are not easily separated from each other, and the housing can have a strong structure. Besides, the present invention provides the upper spiral spring, the lower spiral spring, an upper central shaft and a lower central shaft, which form a symmetrical and balanced double-spring structure; when a flexible printed circuit board is reeled or unreeled, the force and the reaction force generated by the springs are evenly distributed over the upper portion and the lower portion of the rotary sleeve, such that the rotary sleeve can balanced, which make the rotary sleeve can rotate smoothly and will not be easily damaged.

Further scope of applicability of the present application will become more apparent from the detailed description given hereinafter. However, it should be understood that the detailed description and specific examples, while indicating exemplary embodiments of the disclosure, are given by way of illustration only, since various changes and modifications within the spirit and scope of the disclosure will become apparent to those skilled in the art from this detailed description.

BRIEF DESCRIPTION OF THE DRAWINGS

The present disclosure will become more fully understood from the detailed description given herein below and the accompanying drawings which are given by way of illustration only, and thus are not limitative of the present disclosure and wherein.

DETAILED DESCRIPTION

Figure 1:
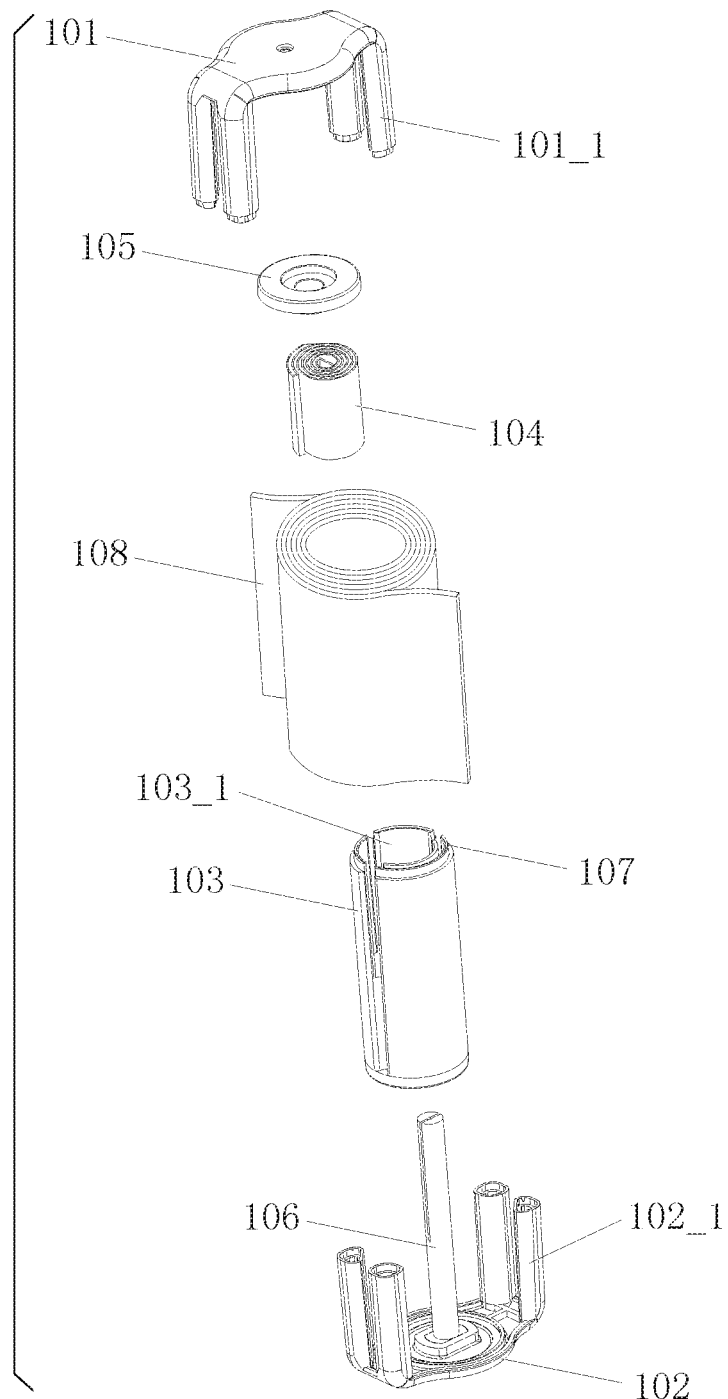
FIG. 1 is an exploded view of a conventional flexible printed circuit board reel device.
Figure 2:
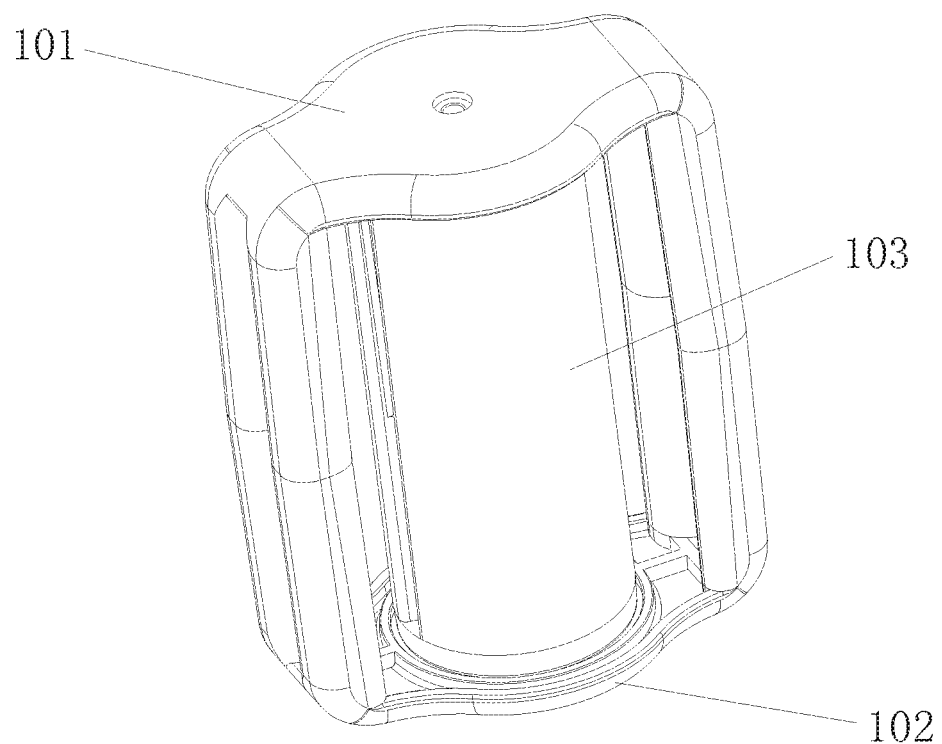
FIG. 2 is structural schematic view of the conventional flexible printed circuit board reel device without spiral spring and flexible printed circuit board.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

First Embodiment

Please refer to FIG. 3~FIG. 14, which show the flexible printed circuit board reel device in accordance with the present invention; the flexible printed circuit board reel device includes a left housing 1, a right housing 2, a rotary sleeve 3, an upper spiral spring 41 and a lower spiral spring 42. The left housing 1 and the right housing 2 are caught with each other to form the housing. More specifically, in the embodiment, the right side of the left housing 1 is provided with a groove, and the left side of the righting housing 2 is provided with a protrusion bar, and the protrusion bar is inserted into the groove to combine the left housing 1 and the right housing 2. The housing of the present invention is composed of the left housing 1 and the right housing 2 closely fixed with each other, which can increase the connection area, whereby the left and right housings are not easily separated from each other, and the housing can have a strong structure. Of course, the outer surface and the lower surface of the top of the housing can be further respectively fixed by a fixation collar, which can be an iron ring; the iron rings can further fix the left housing 1 and the right housing 2 with each other so as to prevent the left housing and the right housing 2 from being separated with each other; furthermore, the upper portions and the lower portions of the front joint and the rear joint of the right housing 1 and the right housing 2 can be further installed with the connection elements, which can be metal connection elements; one end of each connection element is fixed at the left housing 1 and the other end thereof is fixed at the right housing 2, whereby the left housing 1 can be firmly connected to the right housing 2 to prevent the left housing and the right housing 2 from being separated with each other.

Moreover, the left housing 1 and the right housing 2 of the present invention are respectively provided with a board outlet 91, and the two board outlets 91 are opposite to each other, such that one end of the flexible printed circuit board 10 can be pulled out from one of the board outlets 91 and the other end thereof can be pulled out from the other one of the board outlets 91.

Figure 11:
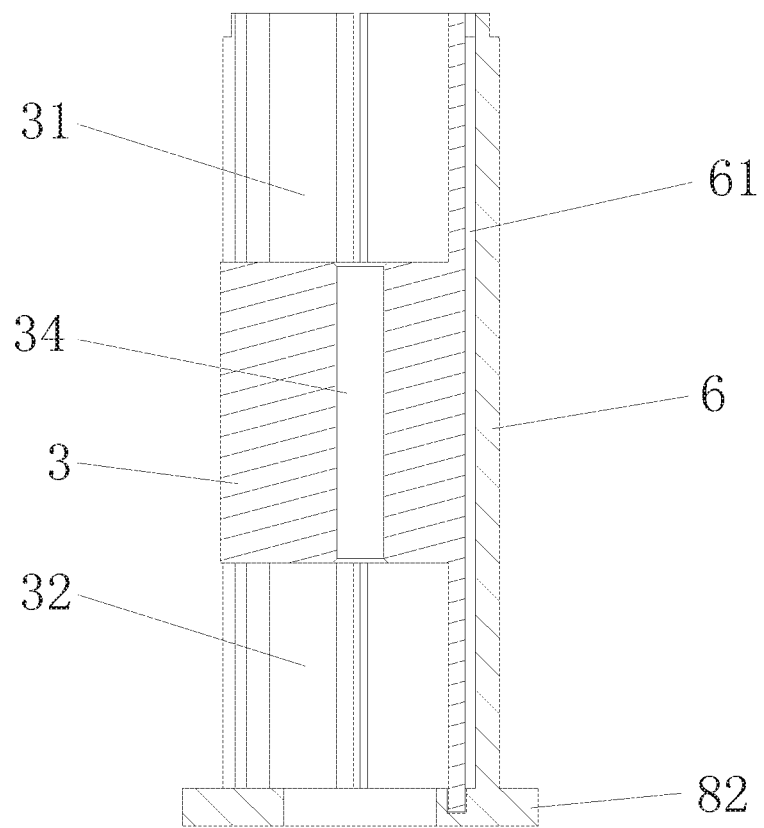
FIG. 11 is an A-A sectional view of FIG. 10.
Figure 12:
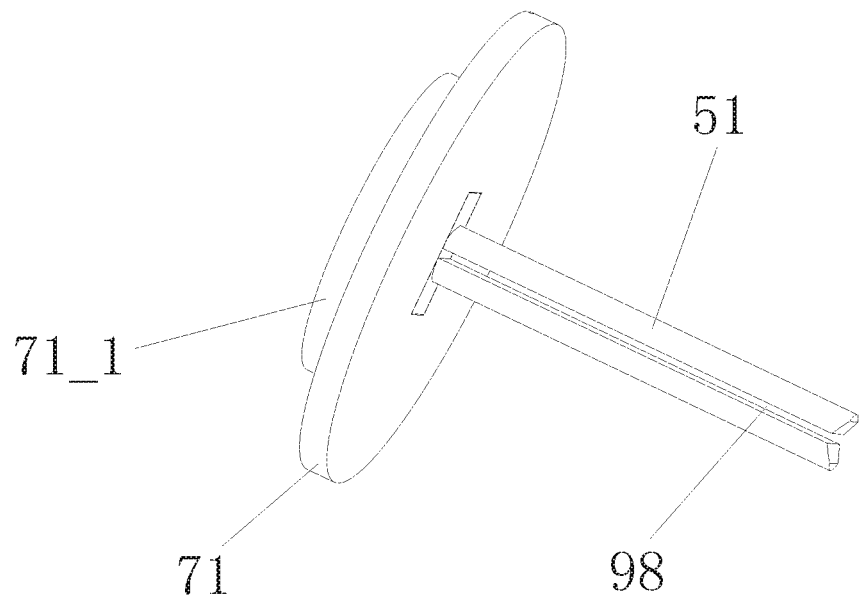
FIG. 12 is a structural schematic view of the upper outer rotary axial plate of the first embodiment in accordance with the present invention.
Figure 13:
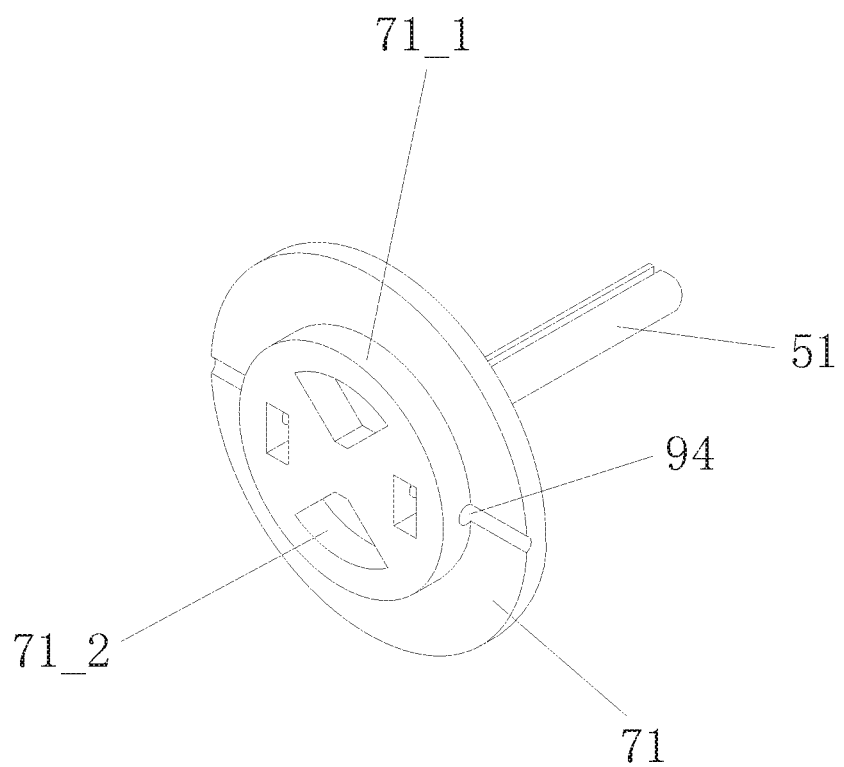
FIG. 13 is a structural schematic view of another view angle of FIG. 12.
Figure 14:
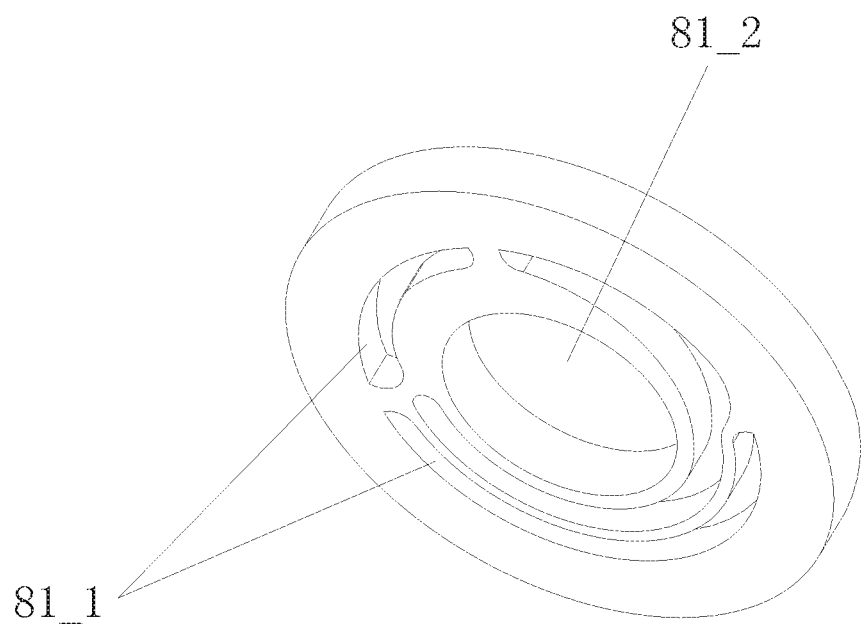
FIG. 14 is a structural schematic view of the upper rotary sleeve cover of the first embodiment in accordance with the present invention.
Figure 15:
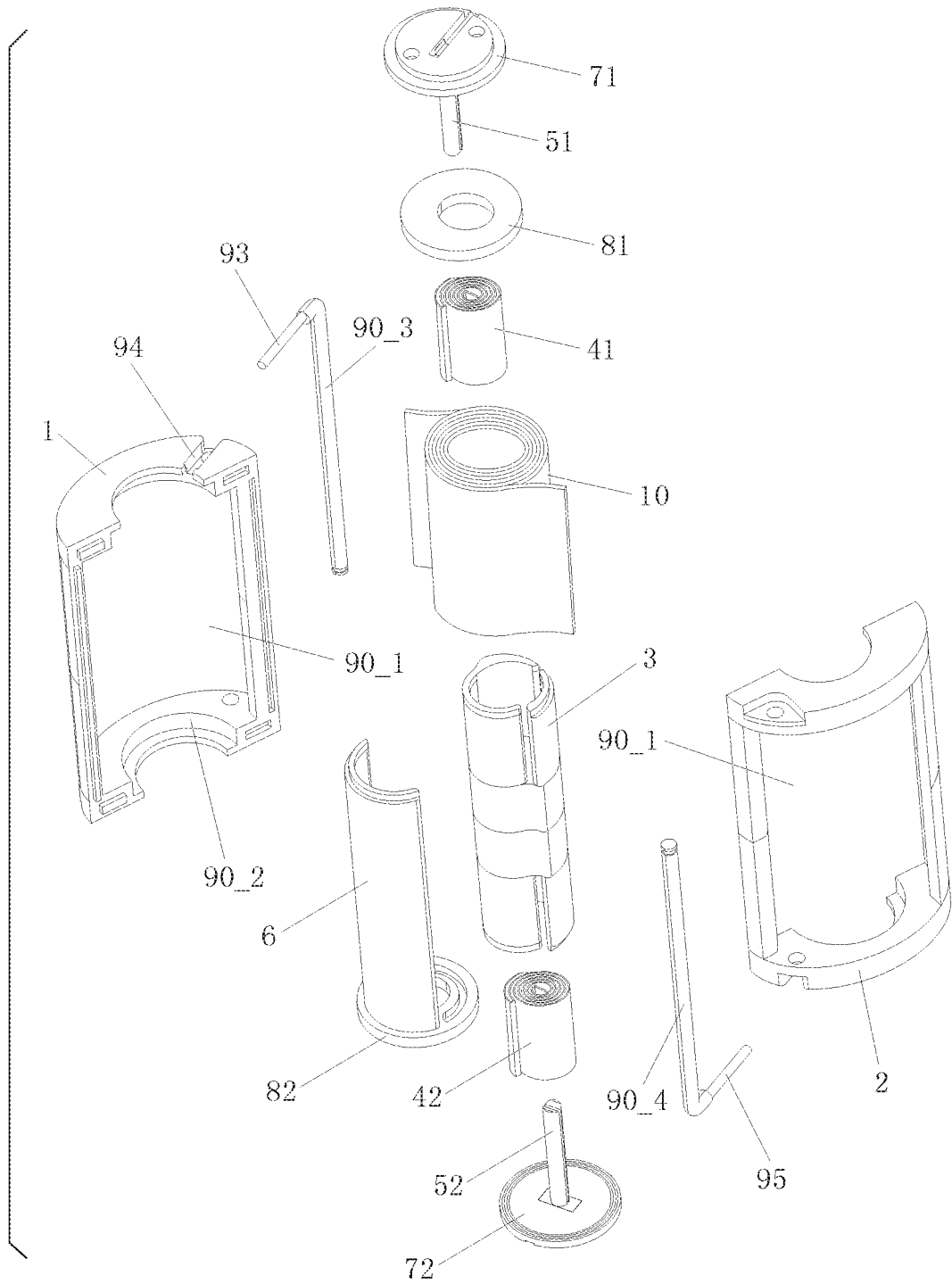
FIG. 15 is an exploded view of a second embodiment in accordance with the present invention.
Figure 16:
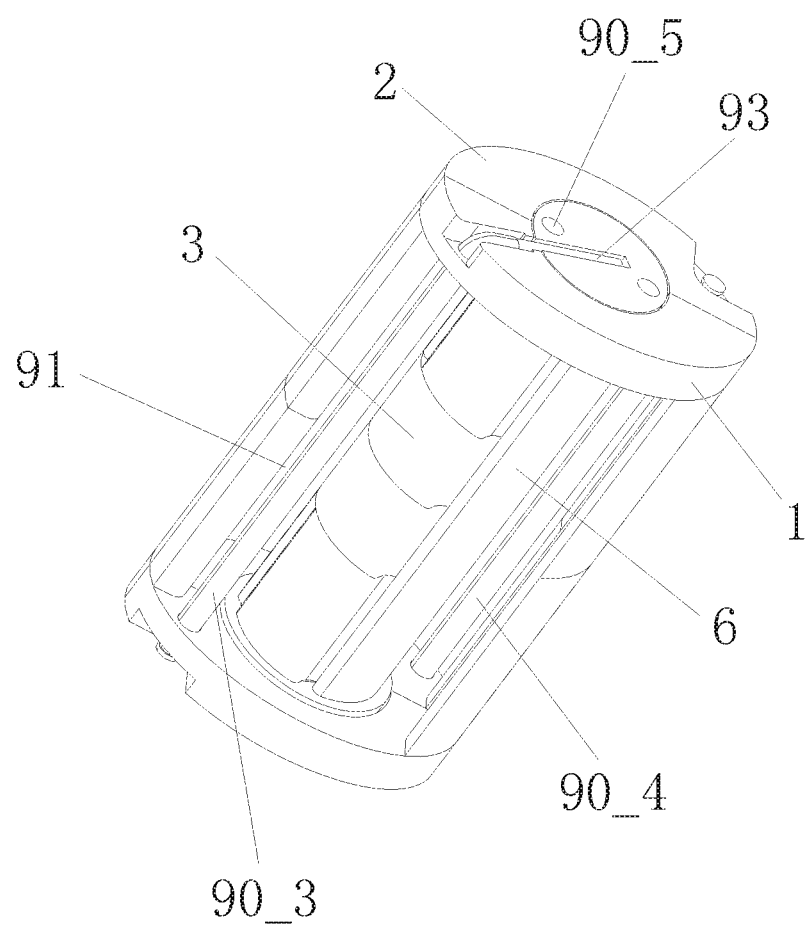
FIG. 16 is a structural schematic view of the second embodiment in accordance with the present invention without flexible printed circuit board, upper spiral spring and lower spiral spring.
Figure 17:
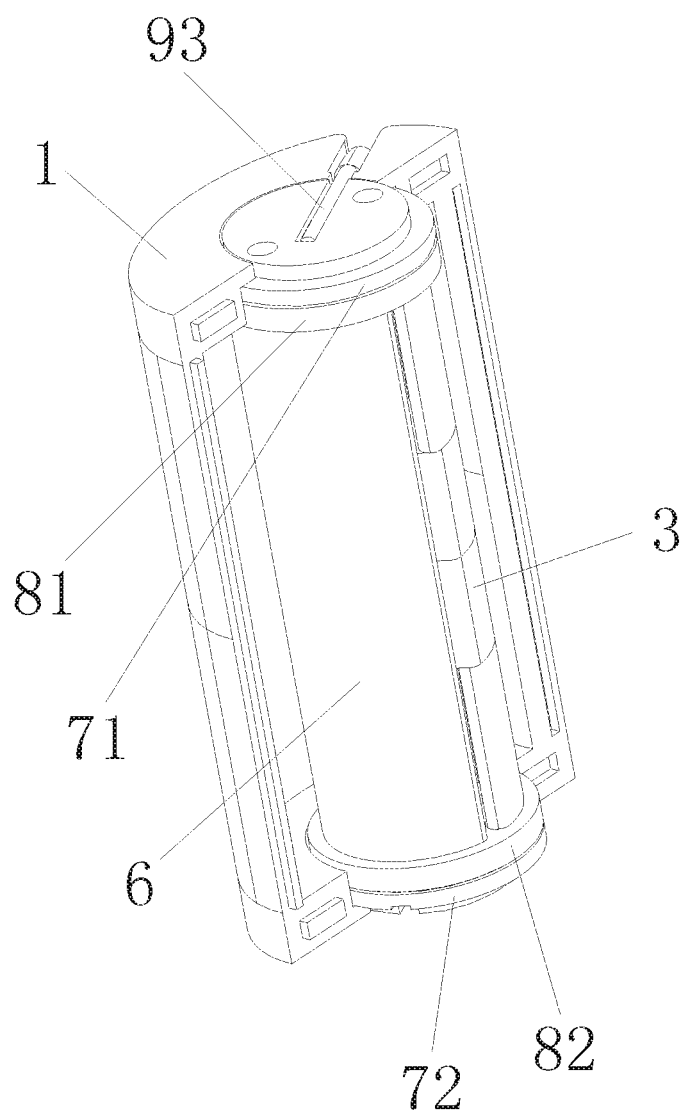
FIG. 17 is a structural schematic view of FIG. 16 without right housing.
Figure 18:
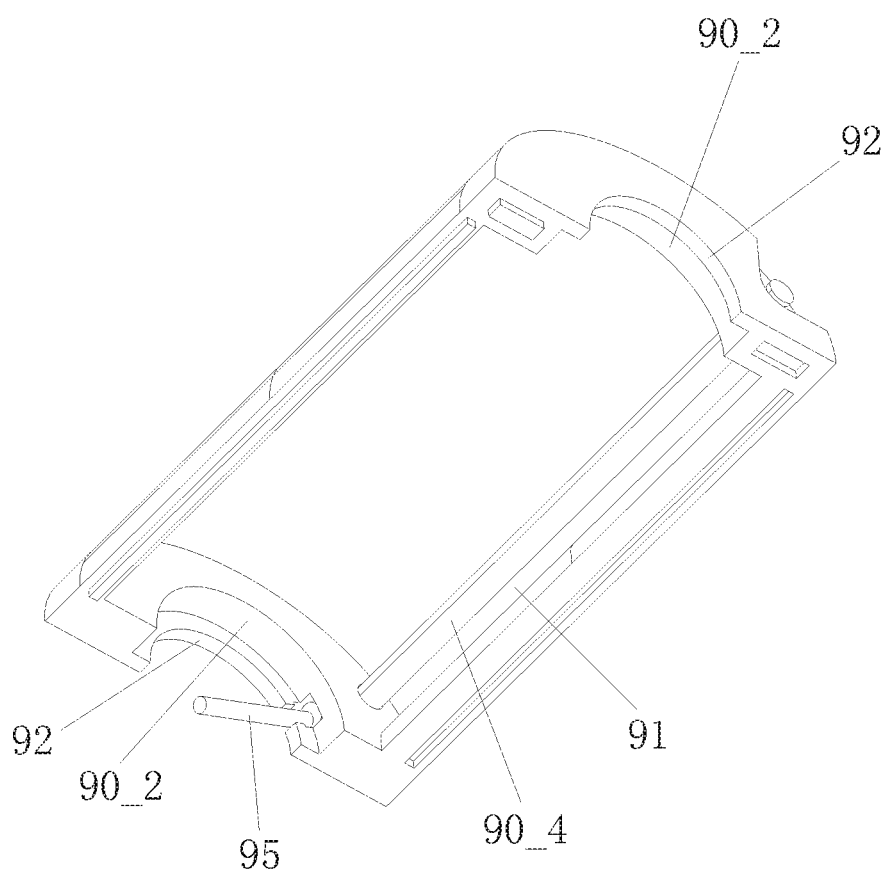
FIG. 18 is a structural schematic view of right housing, right metal column and lower positioning column of the second embodiment in accordance with the present invention.

The upper portion of the rotary sleeve 3 of the present invention is provided with an upper accommodating space 31 and the lower portion of the rotary sleeve 3 is provided with a lower accommodating space 32 (as shown in FIG. 11), and the upper spiral spring 41 is disposed in the upper accommodating space 31 of the rotary sleeve 3 and the lower spiral spring 42 is disposed at the lower accommodating space 32 of the rotary sleeve 3. The upper portion of the housing is provided with an upper central shaft 51 and the lower portion of the housing is provided with a lower central shaft 52. The upper central shaft 51 extends into the upper accommodating space 31 of the rotary sleeve 3 and catches the upper spiral spring 41 and the lower central shaft 52 extends into the lower accommodating space 32 of the rotary sleeve 3 and catches the lower spiral spring 42, whereby the rotary sleeve 3 is rotatably disposed in the housing, and the outer surface of the rotary sleeve 3 is provided with a protection sheet 6 for catching the flexible printed circuit board 10. In the above structure, the upper accommodating space 31 is symmetrical to the lower accommodating space 32; the upper spiral spring 41 is symmetrical to the lower spiral spring 42, and the upper central shaft 51 is symmetrical to the lower central shaft 52, which form a balanced double-spring structure. When the flexible printed circuit board 10 is reeled or unreeled, the force and the reaction force generated by the springs (the upper spiral spring 41 and the lower spiral spring 42) are evenly distributed over the upper portion and the lower portion of the rotary sleeve 3, such that the rotary sleeve 3 can balanced, which make the rotary sleeve 3 can rotate smoothly and will not be easily damaged.

Preferably, the top of the housing is provided with an upper outer rotary axial plate 71 circular in shape; the upper outer rotary axial plate 71 cover the top of the rotary sleeve 3, and the surface of the upper side of the upper outer rotary axial plate 71 is provided with a protrusion 71_1 circular in shape. The top of the left housing 1 and the top of the right housing 2 are respectively provided with a slot 92 semi-circular in shape corresponding to the protrusion 71_1, the semi-circular slot 91 of the left housing 1 and the semi-circular slot 91 of the right housing 2 can be combined to just catch the protrusion 71_1, whereby the protrusion 71_1 of the upper outer rotary axial plate 71 is rotatably installed on the top of the housing. The top of the upper central shaft 51 is fixed at the bottom of the upper outer rotary axial plate 71, whereby the upper outer rotary axial plate 71 is able to drive the rotary sleeve 3 to rotate via the upper central shaft 51.

The upper outer rotary axial plate 71 is further provided with a fixation element for being fixed on the housing; if necessary, the upper outer rotary axial plate 71 can be firmly fixed at the housing via the fixation element. For example, in the embodiment, the fixation element of the upper outer rotary axial plate 71 is an upper positioning column 93, and the housing and the protrusion 71_1 of the upper outer rotary axial plate 71 are respectively provided with an upper positioning hole 94 in the same line. In the embodiment, the upper portion of the left housing 1, the protrusion 71_1 of the upper outer rotary axial plate 71 and the upper portion of the upper outer rotary axial plate 71 and the right housing 2 are respectively provided with an upper positioning hole 94. When the upper positioning column 93 penetrates through the upper positioning hole 94, the upper outer rotary axial plate 71 and the housing are firmly fixed with each other because the upper positioning column 93 is fixed at the upper positioning hole 94. On the contrary, when the upper positioning column 93 fails to be inserted into the upper positioning hole 94, the upper outer rotary axial plate 71 can rotate freely.

Therefore, as described above, when the upper positioning column 93 fails to be inserted into the upper positioning hole 94, the upper central shaft 51 can be driven to rotate by rotating the upper outer rotary axial plate 71; then, the upper central shaft 51 can rotate to tighten the upper spiral spring 41 so as to make the rotary sleeve 3 to rotate to reel the flexible printed circuit board 10. On the contrary, when the upper positioning column 93 is inserted into the upper positioning hole 94, and the flexible printed circuit board 10 is pulled out to rotate the rotary sleeve 3, the upper spiral spring gets loose because the upper outer rotary axial plate 71 is fixed. The advantage of the structure is that as the upper outer rotary axial plate 71 has the function to rotate the rotary sleeve 3 from outside, so it is possible to hold the outer surface of the upper outer rotary axial plate 71 to rotate it to tighten the upper spiral spring 41 after all components are assembled; then, the upper positioning column 93 can be inserted in to the upper positioning hole 94 to finish the assembly operation, so the assembly operation is very convenient. On the contrary, when assembling the conventional flexible printed circuit board reel device, the user should tighten the spiral spring in advance and then install the upper housing and the other components, which is very inconvenient for the user.

Preferably, the protrusion 71_1 of the upper outer rotary axial plate 71 is provided with a fan-shaped slot 71_2. When the upper positioning column 93 fails to be inserted into the upper positioning hole 94, the user can conveniently rotate the upper outer rotary axial plate 71 via the fan-shaped slot 71_2.

Those skilled in the art must understand that the bottom of the housing can also have the same mechanism symmetrical to the above structure according to the above structure and principle for the user to rotate the rotary sleeve 3 from the bottom of the housing. For example, in the embodiment, the bottom of the housing is provided with a lower outer rotary axial plate 72 symmetrical to the upper outer rotary axial plate 71 and a lower positioning column 95 symmetrical to the upper positioning column 93, so the user can rotate the rotary sleeve 3 from the top and the bottom of the housing at the same time, which can provide balanced rotation force. Thus, one end of the housing having the mechanism to rotate the rotary sleeve 3 from outside, and all of both ends of the housing having the mechanism to rotate the rotary sleeve 3 from outside should be in the protection range of the present invention.

More specifically, the top of the upper central shaft 51 can be integrally formed with the lower surface of the upper outer rotary axial plate 71, and the bottom of the lower central shaft 52 can be integrally formed with the upper surface of the lower outer rotary axial plate 72. For example, the upper central shaft 51 and the upper outer rotary axial plate 71 can be integrally formed by plastics, and the lower central shaft 52 and the lower outer rotary axial plate 72 can also be integrally formed by plastics. Of course, the central shaft and the outer rotary axial plate can be manufactured separately; for example, the top of the upper central shaft 51 is caught on the lower surface of the upper outer rotary axial plate 7, and the bottom of the lower central shaft 52 is caught on the upper surface of the lower outer rotary axial plate 72 so as to satisfy the different the material strength requirements of the outer rotary axial plates and the central shafts; once the central shafts connect to the inner center of the spiral spring, the central shafts should resist the tension of the spiral spring stretching or retracting; therefore, the outer rotary axial plates can be made of plastics, but the central shafts can be made of metal bar capable of resisting strong tension and with low diameter.

Preferably, the bottom of the protection sheet 6 is integrally formed with a lower rotary sleeve cover 82 circular in shape, and the lower rotary sleeve cover 82 is provided with a lower slot 82_1, and the bottom of the rotary sleeve 3 is provided with a lower protrusion edge 33 corresponding to the lower slot 82_1 of the lower rotary sleeve cover 82. When assembling the device, the user inserts the lower protrusion edge 33 of the rotary sleeve 3 into the lower slot 82_1 of the lower rotary sleeve cover 82 whereby the lower rotary sleeve cover 82 is caught on the bottom of the rotary sleeve 3, and the protection sheet 6 is fixed on the rotary sleeve 3. Further, a buckle area 63 is formed between the protection sheet 6 and the rotary sleeve 3. The lower rotary sleeve cover 82 is further provided with a lower circular hole 82_2 for the lower central shaft 52 to penetrate through. The top of the rotary sleeve 3 is caught and fixed on the upper rotary sleeve cover 81, and the upper rotary sleeve cover 81 is provided with an upper slot 81_1, and the top of the rotary sleeve 3 and the top of the protection sheet 6 are respectively provided with an upper protrusion edge 97 corresponding to the upper slot 81_1 of the upper rotary sleeve cover 81. When assembling the device, the user inserts the upper protrusion edge 97 into the upper slot 81_1 of the upper rotary sleeve cover 81. Besides, the external diameter of the upper rotary sleeve cover 81 and the external diameter of the lower rotary sleeve cover 82 are slightly shorter than the inner diameter of the housing. Compared with the conventional flexible printed circuit board reel device, the advantages of the above structure are: (1) the rotary sleeve 3 and the protection sheet 6 are two independent components, so the protection sheet 6 can be freely removed to make the assembly operation more convenient; further, which can also avoid the problem that the current plastic injection molding cannot increase the mold removing precision when the mold removing space is too deep and too narrow; thus, the above structure can provide more space for the rotary sleeve 3, and can also make the operation of put the flexible printed circuit board 10 on the outer surface of the rotary sleeve 3 easier; (2) the structure has independent rotary sleeve 3 and protection sheet 6, so the function of the rotary sleeve 3 is only to mount the spiral spring; for the reason, the rotary sleeve 3 can be a simple ring structure; thus, the rotary sleeve 3 can become stronger and will not be deformed or damaged because the spiral spring inside the rotary sleeve 3 stretches or retracts.

Preferably, the center of the rotary sleeve 3 is provided with a penetration hole 34 circular in shape, and the penetration hole 34 interconnects the center of the upper accommodating space 31 to the center of the lower accommodating space 32, whereby the bottom of the upper central shaft 51 is disposed at the top of the penetration hole 34, and the top of the lower central shaft 52 is disposed at the bottom of the penetration hole 34. In addition, the upper central shaft 51 is provided with a clamping groove 98 for catching the inner center of the upper spiral spring 41, and the upper portion of the rotary sleeve 3 is provided with a clamping space 99 for catching the outer side of the upper spiral spring 41; the lower central shaft 52 is provided with a clamping groove 98 for catching the inner center of the lower spiral spring 42, and the lower portion of the rotary sleeve 3 is provided with a clamping space 99 for catching the outer side of the lower spiral spring 42. Of course, the upper central shaft 51 and the lower central shaft 52 are at the same vertical line to form the rotation shaft of the rotary sleeve 3. In this way, the rotary sleeve 3 can stably rotate around the rotation shaft formed by the upper central shaft 51 and the lower central shaft 52.

Figure 3:
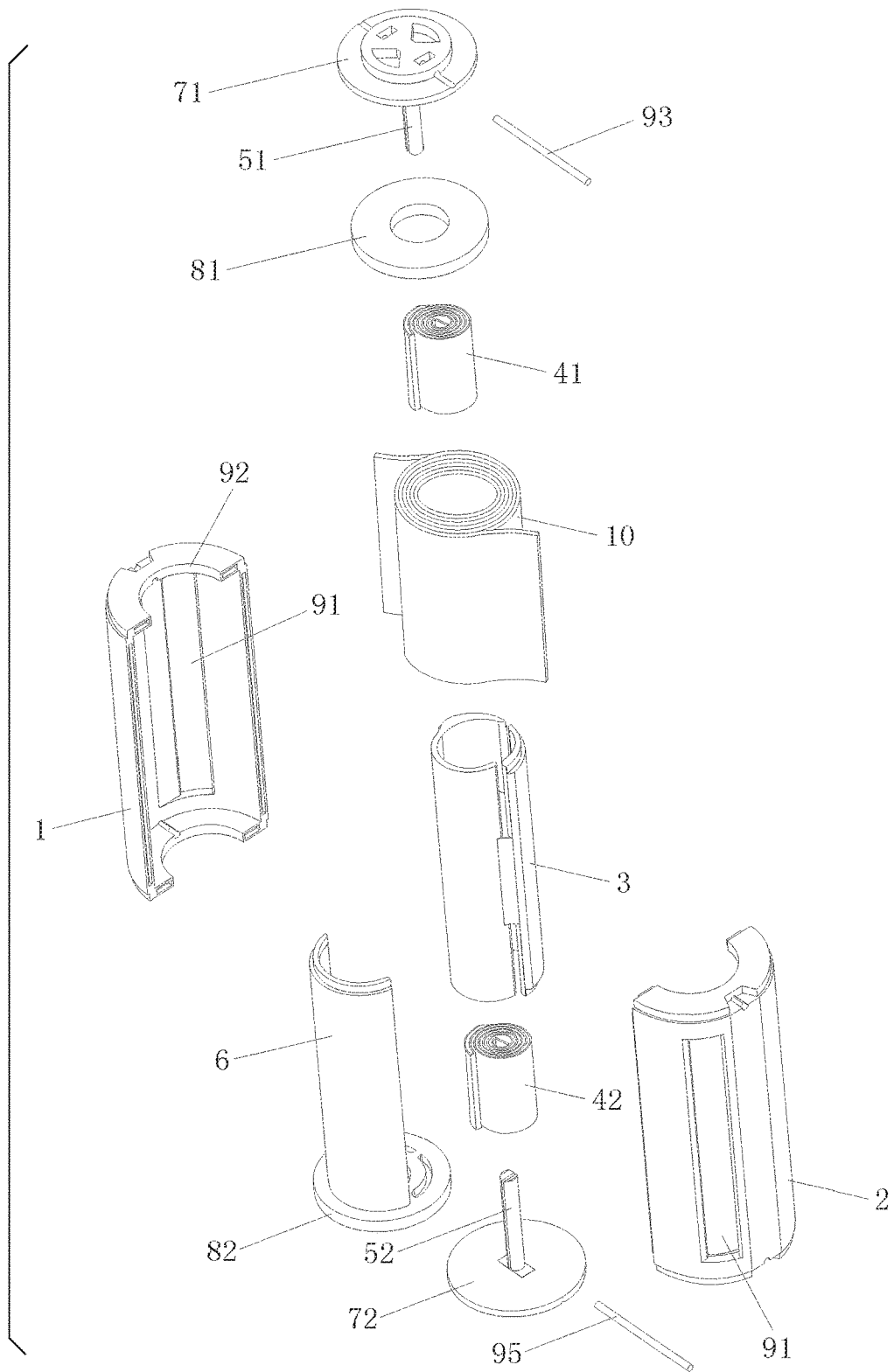
FIG. 3 is an exploded view of a first embodiment in accordance with the present invention.
Figure 4:
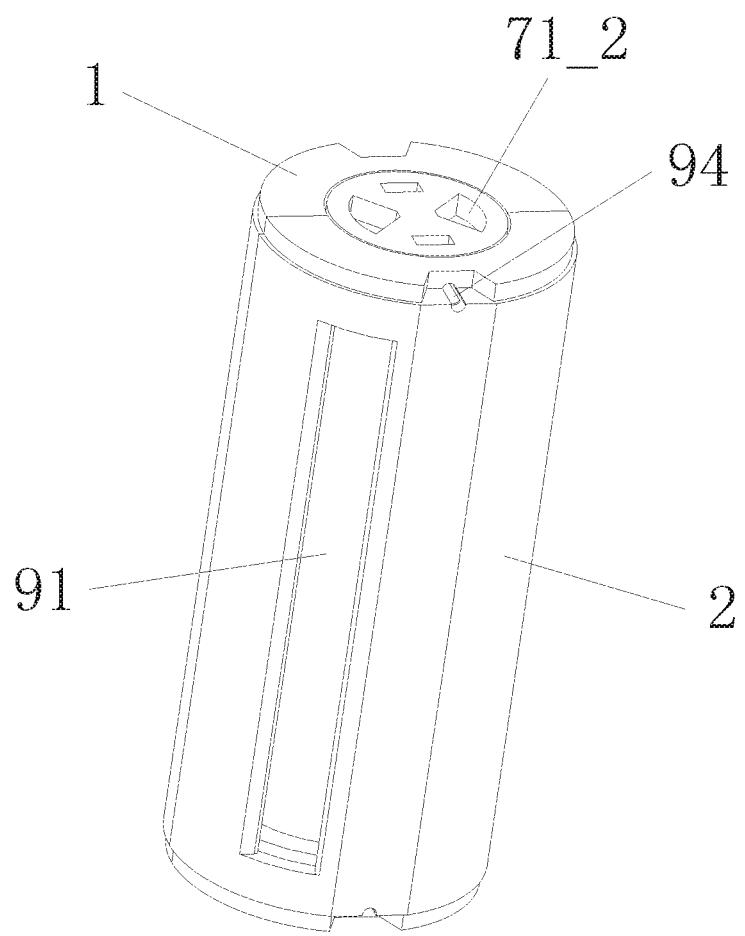
FIG. 4 is a structural schematic view of the first embodiment in accordance with the present invention without flexible printed circuit board, upper spiral spring, lower spiral spring, upper positioning column and lower positioning column.
Figure 5:
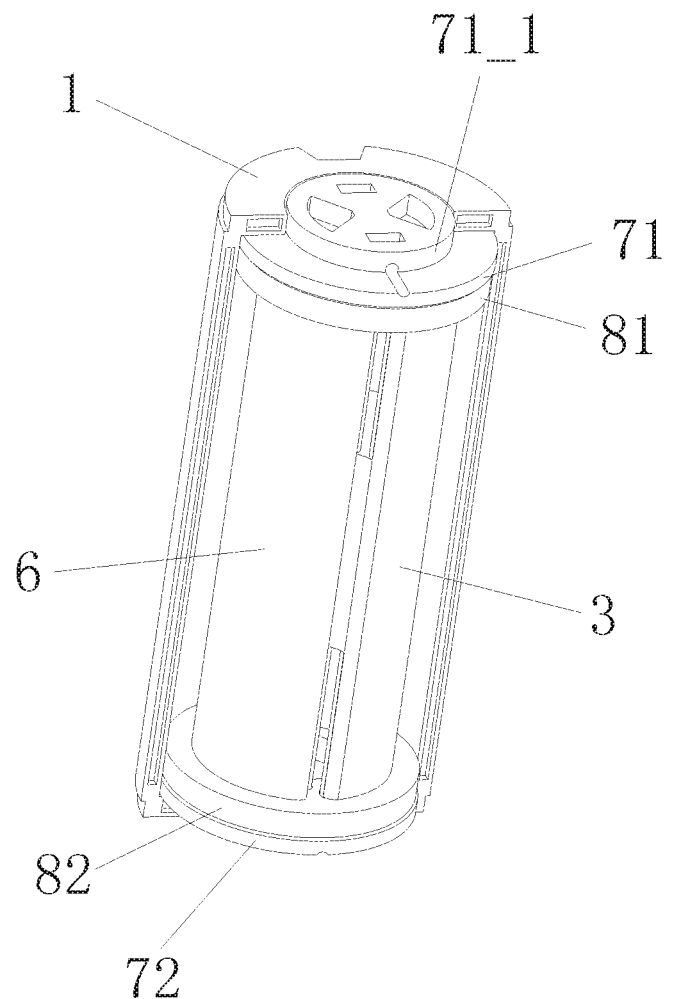
FIG. 5 is a structural schematic view of FIG. 4 without right housing.
Figure 6:
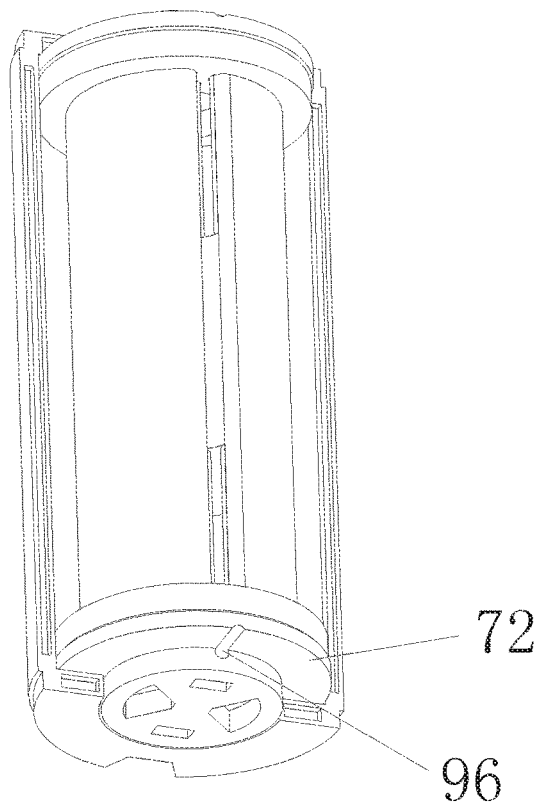
FIG. 6 is a structural schematic view of another view angle of FIG. 5.
Figure 7:
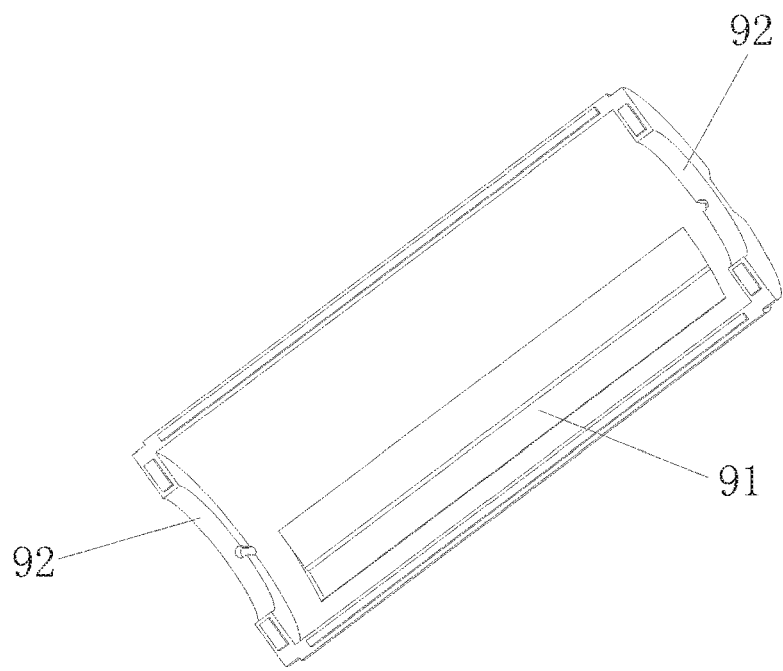
FIG. 7 is a structural schematic view of the right housing of the first embodiment in accordance with the present invention.
Figure 8:
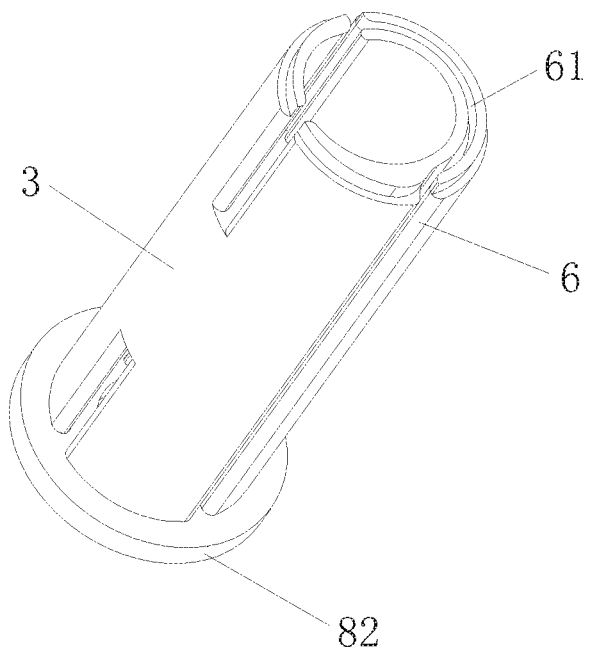
FIG. 8 is a structural schematic view of rotary sleeve, protection sheet and lower rotary sleeve cover of the first embodiment in accordance with the present invention.
Figure 9:
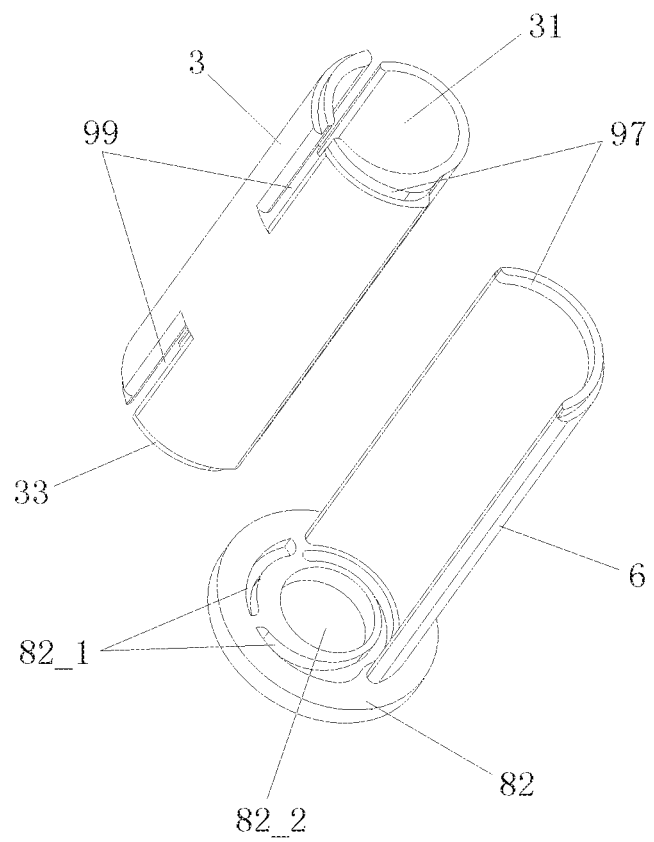
FIG. 9 is an exploded view of FIG. 8.
Figure 10:
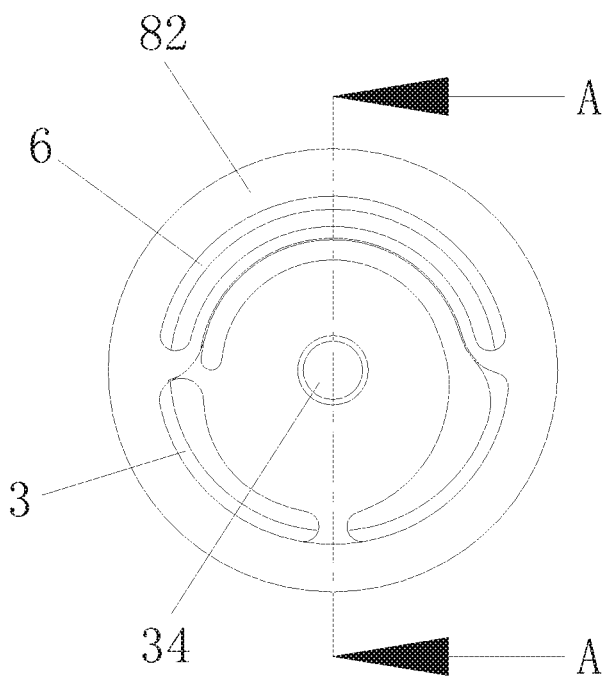
FIG. 10 is a top view of FIG. 8.

Preferably, as shown in FIG. 3 and FIG. 4, the housing composed of the left housing and the right housing of the present invention is a sealing-type housing, and the sealing-type housing is a cylinder; thus, the reel device can have a circular and smooth appearance, which is very helpful for the device to smoothly slide inside the narrow and limited space of the housing of a server, and can avoid the device may be influenced by the internal components of the housing of the server when moving forward or backward.

The assembly process of the present invention is: first, put the upper spiral spring 41 into the upper accommodating space 31 of the rotary sleeve 3, and put the lower spiral spring 42 into the lower accommodating space 32 of the rotary sleeve 3, and make the outer side of the upper spiral spring 41 be caught on the clamping space 99 at the upper portion of the rotary sleeve 3, and make the outer side of the lower spiral spring 42 be caught on the clamping space at the lower portion of the rotary sleeve 3; then, put the flexible printed circuit board 10 around the outer surface of the rotary sleeve 3, and then fix the protection sheet 4 to make the flexible printed circuit board 10 be fixed in the buckle area 61 between the protection sheet 6 and the outer surface of the rotary sleeve 3; next, catch the upper rotary sleeve cover 81 on the top of the rotary sleeve 3; then, install the upper outer rotary axial plate 71 and the lower outer rotary axial plate 71, and then make the inner center of the upper spiral spring 41 be caught on the clamping groove 98 of the upper central shaft 51, and make the inner center of the lower spiral spring 42 be caught on the clamping groove 98 of the lower central shaft 52; afterward, combine and catch the left housing 1 and the right housing 2, and then make one end of the flexible printed circuit board 10 penetrate out of the board outlet 91 of the left housing 1, and the other end thereof penetrate out of the board outlet 91 of the right housing 2; then, hold the upper surfaces of the upper outer rotary axial plate 71 and the lower outer rotary axial plate 72 at the same time to rotate them to tighten the upper spiral spring 41 and the lower spiral spring 42; finally, insert the upper positioning column 93 into the upper positioning hole 84, and insert the lower positioning column 95 into the lower positioning hole 96 to finish the assembly process.

The working principle of the present invention is: during the initial status, the flexible printed circuit board 10 is reeled around the rotary sleeve 3; when it is necessary to pull out the flexible printed circuit board 10, the user can pull one end or both ends of the flexible printed circuit board 10 to stretch the flexible printed circuit board 108 and make the flexible printed circuit board 10 being the stretching status; at this time, if the user release the flexible printed circuit board 10 or let it freely move with the rotary sleeve 10, the rotary sleeve 3 rotates by the spring force provided by the upper spiral spring 41 and the lower spiral spring 42, so the flexible printed circuit board 10 can be reeled by the rotary sleeve 3 to return to the initial status; in this way, the flexible printed circuit board 10 can be automatically reeled.

Second Embodiment 2

Please refer to FIG. 15~FIG. 18, which show a second embodiment of a flexible printed circuit board reel device in accordance with the present invention. The difference between the first embodiment and the second embodiment is that the left housing 1 and the right housing 2 are respectively provided with a window 90_1 for accommodating a flexible printed circuit board 10 when the flexible printed circuit board 10 is reeled, such that the housing composed of the left housing 1 and the right housing 2 is a half-opened type housing, and the half-opened type housing is elliptical in shape; besides, the vertical axis of the half-opened type housing is longer than the horizontal axis thereof; in other words, the vertical axis is the long axis, and the horizontal axis is the short axis, which just likes a cylindrical housing body without the left portion and the right portion. Moreover, the left housing 1 and the right housing 2 are respectively provided with a restrict slot 90_2 semi-circular in shape. After the left housing 1 and the right housing 2 are caught on and combined with each other, the restrict slot 90_2 is corresponding to the inner side of the housing of the first embodiment so as to match the upper rotary sleeve cover 81 and the lower rotary sleeve cover 82 without influencing the rotation of the rotary sleeve 3. In the embodiment, the elliptical half-opened type housing provides more space for rotary sleeve 3 inside the housing, so the rotary sleeve 3 can reel more flexible printed circuit board 10.

In the embodiment, the window 90_1 of the left housing 1 is provided with a left metal support column 90_3, and the left metal support column 90_3 is close to a rear end of the window 90_1 of the left housing 1, whereby the left metal support column 90_3 and the rear end of the window 90_1 of the left housing 1 form the board outlet 91 of the left housing 1. The window 90_1 of the right housing 2 is provided with a right metal support column 90_4, and the right metal support column 90_4 is close to the front end of the right housing 2, whereby the right metal support column 90_4 and the front end of the window 90_1 of the right housing 2 form the board outlet 901 of the right housing 2. As the two ends of the flexible printed circuit board 10 usually need to soldered with a terminal connector larger than it in size before assembling the device; therefore, according to the above structure, when the user assembles the device, the user can make the terminal connector of the flexible printed circuit board 10 penetrate through the window 90_1, and then install the left metal support column 90_3 and the right metal support column 90_4; in this way, the user can conveniently assemble the device. Further, the left metal support column 90_3 and the right metal support column 90_4 can contact the force-taken column of the flexible printed circuit board 10 when the flexible printed circuit board 10 is stretching, but the left metal support column 90_3 and the right metal support column 90_4 have better wear-resistivity and strength; for the reason, the service life can be increased.

In the embodiment, the left metal support column 90_3 is integrally formed with the upper positioning column 93, and the right metal support column 09_4 is integrally formed with the lower positioning column 95. This structure is convenient for assembly operation and production. More specifically, the bottom of the left metal support column 90_3 is caught on and fixed at the bottom of the left housing 1, and the upper positioning column 93 is integrally formed with the top of the left metal support column 90_3; the upper positioning hole 94 is at the top of the left housing 1, and the protrusion 71_1 of the upper outer rotary axial plate 71; the top of the right housing 2 has no positioning hole. The top of the right metal support column 90_4 is caught on and fixed at the top of the right housing 2; the lower positioning hole 95 is integrally formed with the bottom of the right metal support column 90_4, and the protrusion 71_1 of the lower outer rotary axial plate 72; the bottom of the left housing 1 has no positioning hole. The upper outer rotary axial plate 71 and the lower outer rotary axial plate 72 are respectively provided with a hole 90_5 which can be rotated from outside. Of course, the "L-shaped" structure integrally formed by the metal support column and the positioning column can be separated into two independent components, the metal support column and the positioning column, for production, which should be included into the protection range of the present invention.

The other structures and working principles of the embodiment are similar to those of the first embodiment, so will not be described again therein.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A flexible printed circuit board real device, characterized in comprising a left housing, a right housing, a rotary sleeve, an upper spiral spring and a lower spiral spring, wherein the left housing and the right housing are caught with each other to form a housing, and the left housing and the right housing are respectively provided with a board outlet; an upper portion of the rotary sleeve is provided with an upper accommodating space and a lower portion of the rotary sleeve is provided with a lower accommodating space, and the upper spiral spring is disposed in the upper accommodating space and the lower spiral spring is disposed at the lower accommodating space; an upper portion of the housing is provided with an upper central shaft and an lower portion of the housing is provided with a lower central shaft, and the upper central shaft extends into the upper accommodating space of the rotary sleeve and catches the upper spiral spring and the lower central shaft extends into the lower accommodating space of the rotary sleeve and catches the lower spiral spring, whereby the rotary sleeve is rotatably disposed in the housing, and an outer surface of the rotary sleeve is provided with a protection sheet for catching the flexible printed circuit board.

2. The flexible printed circuit board reel device of claim 1, characterized in that a top of the housing is provided with an upper outer rotary axial plate circular in shape; the upper outer rotary axial plate covers a top of the rotary sleeve, and a surface of an upper side of the upper outer rotary axial plate is provided with a protrusion circular in shape; a top of the left housing and a top of the right housing are respectively provided with a slot semi-circular in shape corresponding to the protrusion, whereby the protrusion of the upper outer rotary axial plate is rotatably installed on the top of the housing; a top of the upper central shaft is fixed at a bottom of the upper outer rotary axial plate whereby the upper outer rotary axial plate is able to drive the rotary sleeve to rotate via the upper central shaft; the upper outer rotary axial plate is further provided with a fixation element for being fixed on the housing.

3. The flexible printed circuit board reel device of claim 2, characterized in that the fixation element of the upper outer rotary axial plate is an upper positioning column, and the housing and the protrusion of the upper outer rotary axial plate are respectively provided with an upper positioning hole in the same line, whereby when the upper positioning column penetrates through the upper positioning holes, the upper outer rotary axial plate and the housing are fixed by and connected to each other.

4. The flexible printed circuit board reel device of claim 3, characterized in that a bottom of the housing is provided with a lower outer rotary axial plate symmetrical to the upper outer rotary axial plate, and a lower positioning column symmetrical to the lower positioning column; a top of the upper central shaft is integrally formed with or caught on a bottom side of the upper outer rotary axial plate, and a bottom of the lower central shaft is integrally formed with or caught on an upper side of the lower outer rotary axial plate.

5. The flexible printed circuit board reel device of claim 1, characterized in that a bottom of the protection sheet is integrally formed with a lower rotary sleeve cover circular in shape, and the lower rotary sleeve cover is provided with a lower slot, and a bottom of the rotary sleeve is provided with a lower protrusion edge corresponding to the lower slot of the lower rotary sleeve cover, whereby the lower rotary sleeve cover is caught on the bottom of the rotary sleeve, and the protection sheet is fixed on the rotary sleeve, and a buckle area is formed between the protection sheet and the rotary sleeve; the lower rotary sleeve cover is further provided with a lower circular hole for the lower central shaft to penetrate through; the top of the rotary sleeve is caught and fixed on the upper rotary sleeve cover, and the upper rotary sleeve cover is provided with an upper slot, and the top of the rotary sleeve and a top of the protection sheet are respectively provided with an upper protrusion edge corresponding to the upper slot of the upper rotary sleeve cover.

6. The flexible printed circuit board reel device of claim 1, characterized in that a center of the rotary sleeve is provided with a penetration hole circular in shape, and the penetration hole interconnects a center of the upper accommodating space to a center of the lower accommodating space, whereby a bottom of the upper central shaft is disposed at a top of the penetration hole, and a top of the lower central shaft is disposed at a bottom of the penetration hole.

7. The flexible printed circuit board reel device of claims 1, characterized in that the housing composed of the left housing and the right housing is a sealing-type housing, and the sealing-type housing is a cylinder.

8. The flexible printed circuit board reel device of claim 4, characterized in that the left housing and the right housing are respectively provided with a window for accommodating a flexible printed circuit board when the flexible printed circuit board is reeled, such that the housing composed of the left housing and the right housing is a half-opened type housing, and the half-opened type housing is elliptical in shape, and a vertical axis of the half-opened type housing is longer than a horizontal axis thereof.

9. The flexible printed circuit board reel device of claim 8, characterized in that the window of the left housing is provided with a left metal support column, and the left metal support column is close to a rear end of the window of the left housing, whereby the left metal support column and the rear end of the window of the left housing form the board outlet of the left housing; the window of the right housing is provided with a right metal support column, and the right metal support column is close to a front end of the right housing, whereby the right metal support column and the front end of the window of the right housing form the board outlet of the right housing.

10. The flexible printed circuit board reel device of claim 9, characterized in that the left metal support column is integrally formed with the upper positioning column, and the right metal support column is integrally formed with the lower positioning column.

11. The flexible printed circuit board reel device of claim 2, characterized in that the housing composed of the left housing and the right housing is a sealing-type housing, and the sealing-type housing is a cylinder.

12. The flexible printed circuit board reel device of claim 3, characterized in that the housing composed of the left housing and the right housing is a sealing-type housing, and the sealing-type housing is a cylinder.

13. The flexible printed circuit board reel device of claim 4, characterized in that the housing composed of the left housing and the right housing is a sealing-type housing, and the sealing-type housing is a cylinder.

14. The flexible printed circuit board reel device of claim 5, characterized in that the housing composed of the left housing and the right housing is a sealing-type housing, and the sealing-type housing is a cylinder.

15. The flexible printed circuit board reel device of claim 6, characterized in that the housing composed of the left housing and the right housing is a sealing-type housing, and the sealing-type housing is a cylinder.

* * * * *